(12) United States Patent
Verhaar (10) Patent No.: US 6,696,724 B2
(45) Date of Patent: Feb. 24, 2004

(54) TWO-TRANSISTOR FLASH CELL

(75) Inventor: Robertus Dominicus Joseph Verhaar, Nijmegen (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 10/125,446

(22) Filed: Apr. 18, 2002

(65) Prior Publication Data

US 2002/0153546 A1 Oct. 24, 2002

(30) Foreign Application Priority Data

Apr. 20, 2001 (EP) .............................................. 01201434

(51) Int. Cl.[7] ........................ H01L 29/788; H01L 29/78; H01L 29/76; H01L 21/336; G11C 16/04
(52) U.S. Cl. ........................ 257/314; 257/315; 257/316; 257/319; 257/320; 257/321; 438/263; 438/264; 365/185.01
(58) Field of Search ................................. 257/314, 315, 257/316, 317, 319, 320, 321; 365/185.01; 438/263, 264

(56) References Cited

U.S. PATENT DOCUMENTS

| 5,049,515 A | 9/1991 | Tzeng | 437/43 |
|---|---|---|---|
| 5,495,441 A | 2/1996 | Hong | 365/185.01 |
| 5,675,161 A | 10/1997 | Thomas | 257/316 |
| 5,932,908 A | * 8/1999 | Noble | 257/315 |
| 6,291,853 B1 | * 9/2001 | Io | 257/315 |

* cited by examiner

Primary Examiner—Eddie Lee
Assistant Examiner—Samuel A Gebremariam
(74) Attorney, Agent, or Firm—Aaron Waxler (57) ABSTRACT

A semiconductor device comprising a non-volatile memory cell (20; 200) for storing a bit, arranged in a semiconductor substrate (21) containing a first dopant type, the memory cell including a drain (24) in the substrate (21), a floating gate (29), a control gate (30), a thin gate isolation layer (27), and an insulating layer (32), the insulating layer (32) being above the floating gate (29), the control gate (30) being above the insulating layer (32), the floating gate (29) being above the thin gate isolation layer (27), and the cell further including an access transistor (34) for controlling access to the non-volatile memory cell (20; 200), the cell (20; 200) including a buried substrate layer (22) containing a second dopant type and a source (26), and the access transistor (34) being formed in the substrate (21), in a trench adjacent to the floating gate (29), said trench extending substantially from the source (26) to the substrate's surface.

8 Claims, 7 Drawing Sheets

TWO-TRANSISTOR FLASH CELL

FIELD OF THE INVENTION

The present invention relates to a semiconductor device comprising a non-volatile memory cell for storing at least one bit, according to the preamble of claim 1.

BACKGROUND AND SUMMARY OF THE INVENTION

Figure 1:
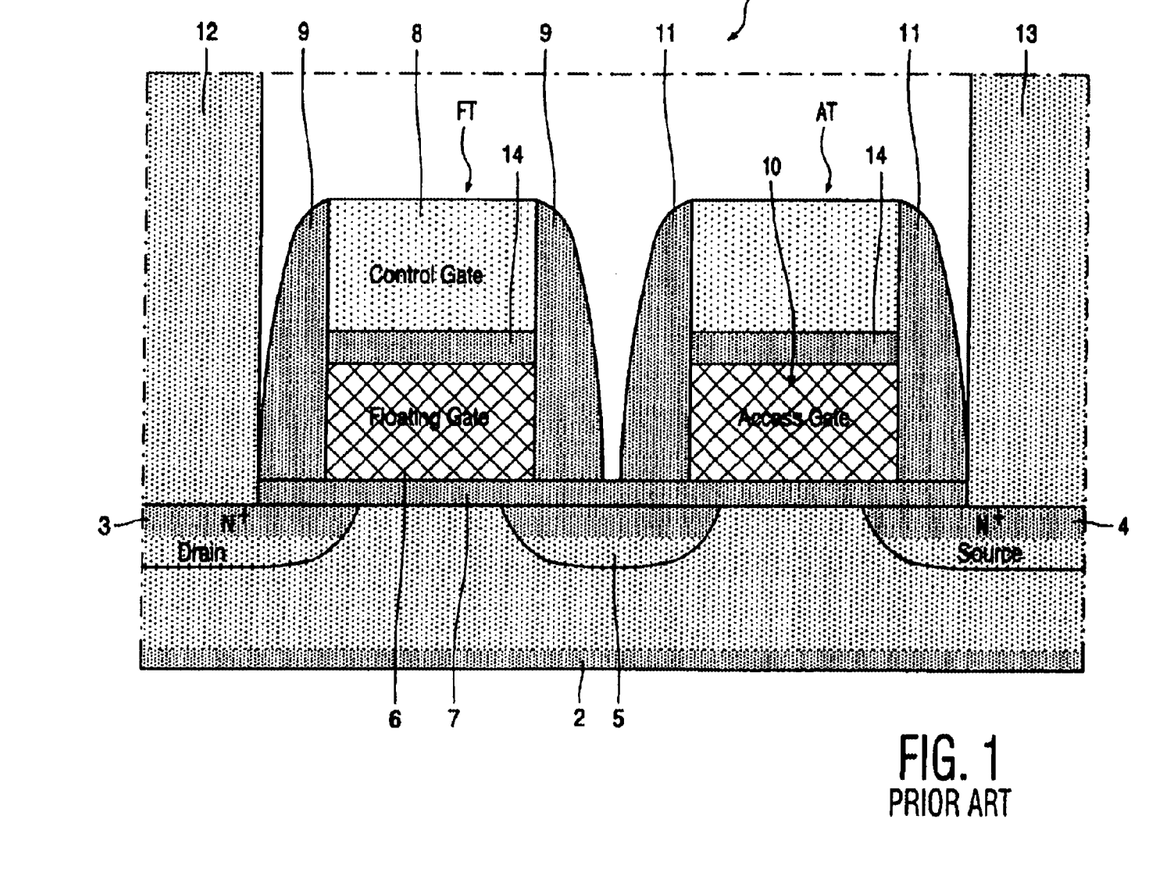
FIG. 1 schematically shows a cross-section of a 2T non-volatile memory cell known from the prior art.

Such non-volatile memory cells are well known from the prior art in a plurality of varieties. FIG. 1 shows schematically a cross-section of an exemplary prior art planar 2T non-volatile memory cell.

The depicted 2T non-volatile memory cell 1, also known as Flash cell, is of the planar type and comprises two distinct transistors, viz. a floating gate transistor FT and an access transistor AT. On a p-type substrate 2, an n-type drain region 3, an n-type source region 4, an n-type doped region 5 are formed. On the surface, between drain region 3 and doped region 5, a floating gate 6 is formed on a thin gate oxide 7. On top of the floating gate 6, a control gate 8 is formed. The control gate 8 is separated from the floating gate 6 by an isolating layer 14, e.g., an oxide layer or an oxide-nitride-oxide layer. Insulating side spacers 9 are formed on the sides of the stack of the floating gate 6 and the control gate 8. Adjacent to this stack, between the doped region 5 and the source region 4, an access gate 10 is formed on the thin gate oxide 7 on the surface of the substrate 2. As shown here, the access transistor may comprise a stack similar to the stack comprising the floating gate 6, the isolating layer 14 and the control gate 8, but the access gate may also comprise a structure consisting of only a single layer. Also the sidewalls of the access gate 10 are covered by an insulating spacer 11. The drain region 3 and the source region 4 are connected to a drain line and a source line, respectively, by the respective drain contact 12 and source contact 13.

In such prior art 2T non-volatile memory cell types arranged as a planar structure, as described above, the select gate is usually positioned next to the control gate which is arranged on the floating gate. This planar arrangement has the disadvantage that a non-volatile memory cell of this type occupies a relatively large area on the semiconductor surface. The advance of processing technologies enables structures having smaller feature sizes to be manufactured, so that the cell size of these planar 2T cells can be reduced. However, the size reduction is limited due to a number of structural constraints, e.g. minimal contact sizes, minimal spacer thickness, etc. Scaling down of the structure as shown in FIG. 1 is limited by its design: i.e., certain minimal sizes within the structure must be maintained. Using 0.18 $\mu$m design rules, such a memory cell will typically have a size of 0.6–0.8 $\mu m^2$.

U.S. Pat. No. 5,386,132 discloses a more compact arrangement of a Flash memory cell in FIGS. 9A and 9B. This non-volatile memory cell is arranged as a two-transistor (2T) vertical split channel EEPROM on a semiconductor substrate and comprises a source region, a drain region, a control gate, a floating gate and a select gate, the control gate being arranged as a pillar inside a trench. The floating gate is arranged as a tube surrounding this pillar-shaped control gate. The select gate is arranged as an annular structure surrounding the control gate in the top region of the control gate. The drain region is also arranged as an annular structure, which surrounds the control gate just below the select gate. The source region is located below the control gate pillar.

The non-volatile memory cell of U.S. Pat. No. 5,386,132 advantageously reduces the area needed on the substrate, and allows further downsizing and/or higher densities of EEPROM and FLASH memory devices.

However, the fabrication of such a non-volatile memory cell, as disclosed in U.S. Pat. No. 5,386,132, is very complex due to the application of an annular double trench structure. In particular, the separation of the respective gates by a thin oxide is difficult and may disadvantageously reduce the process yield and the reliability of the non-volatile memory cell.

Moreover, in the non-volatile memory cell of U.S. Pat. No. 5,386,132, the select gate and the control gate are interconnected. During the programming steps (write and erase) and the reading steps of such a memory cell both select gate and control gate have the same potential. Separate control of the respective gate potentials is not possible.

It is an object of the present invention to provide a semiconductor device comprising a 2T non-volatile memory cell for storing at least one bit that is more compact than planar 2T non-volatile memory cells known from the prior art. The present invention relates to a semiconductor device comprising, in a semiconductor substrate containing a first dopant type, a first non-volatile memory cell for storing a bit, comprising a first drain region in the substrate, a first floating gate, a first control gate, a first thin gate isolation layer, and an insulating layer, the insulating layer being positioned on top of the first floating gate, the first control gate being positioned on top of the insulating layer, the first floating gate being positioned on top of the first thin gate isolation layer, and further comprising a first access transistor for controlling access to the first non-volatile memory cell, wherein the first non-volatile memory cell comprises a buried layer in the substrate containing a second dopant type and a first source region, the first access transistor is formed in a first trench on the substrate, the first trench extending substantially from the first source region to the surface of the substrate, the first trench being adjacent to the first floating gate and directed in a first direction parallel to the surface of the substrate.

In comparison with a non-volatile memory cell of the prior art, the present invention provides a non-volatile memory cell with a smaller cell size.

Moreover, in a first embodiment the present invention relates to a semiconductor device as described above, comprising in the semiconductor substrate, a second non-volatile memory cell for storing a bit, comprising a second drain region in the substrate, a second floating gate, a second control gate, a second thin gate isolation layer, and a second insulating layer, the second insulating layer being positioned on top of the second floating gate, the second control gate being positioned on top of the second insulating layer, the second floating gate being positioned on top of the second thin gate isolation layer, the buried layer containing a second source region, and the device further comprising a second access transistor for controlling access to the second non-volatile memory cell, the second non-volatile memory cell being adjacent to the first non-volatile memory cell in a second direction, the second direction being parallel to the surface of the substrate and perpendicular to the first direction, wherein the second access transistor is formed in a second trench on the substrate, the second trench extending substantially from the second source region to the surface of the substrate, the second trench being adjacent to the second floating gate and directed in the second direction, and the first access transistor of the first non-volatile memory cell being separated from the second access transistor of the second non-volatile memory cell by an isolation gate, comprising a dummy floating gate, a dummy insulating layer and a dummy control gate, the dummy insulating layer being positioned on top of the dummy floating gate, the dummy control gate being positioned on top of the dummy insulating layer. This arrangement of two non-volatile memory cells results in a smaller total area than the area needed for two separate non-volatile memory cells.

Furthermore, a further size reduction for a 2T non-volatile memory cell is achieved by combining the select gates of two adjacent 2T non-volatile memory cells into a single select gate. In a second embodiment, the present invention relates to a semiconductor device as described above, comprising in the semiconductor substrate, a second non-volatile memory cell for storing a bit, comprising a second drain region in the substrate, a second floating gate, a second control gate, the second thin gate isolation layer, and a second insulating layer, the second insulating layer being positioned on top of the second floating gate, the second control gate being positioned on top of the second insulating layer, the second floating gate being positioned on top of the second thin gate isolation layer, the buried layer containing a second source region, and the device further comprising a second access transistor for controlling access to the second non-volatile memory cell, the second non-volatile memory cell being adjacent to the first non-volatile memory cell in a second direction, the second direction being parallel to the surface of the substrate and perpendicular to the first direction, wherein the second access transistor is formed in a second trench on the substrate, the second trench extending substantially from the second source region to the surface of the substrate, the second trench being adjacent to the second floating gate and directed in the second direction, and the first access transistor of the first non-volatile memory cell coinciding with the second access transistor of the second non-volatile memory cell.

The present invention also relates to a non-volatile memory cell matrix comprising a plurality of non-volatile memory cells as described above, wherein the plurality of non-volatile memory cells is arranged in the first direction and the second direction.

Moreover, the present invention also relates to a semiconductor device comprising a non-volatile memory cell matrix as described above.

The present invention also relates to a method of manufacturing a semiconductor device comprising in a semiconductor substrate containing a first dopant type, a first non-volatile memory cell for storing a bit, comprising a first drain region in the substrate, a first floating gate, a first control gate, a buried layer containing a second dopant type and a first source region, a first thin gate isolation layer, and an insulating layer, the insulating layer being positioned on top of the first floating gate, the first control gate being positioned on top of the insulating layer, the first floating gate being positioned on top of the first thin gate isolation layer, said arrangement further comprising a first access transistor, and the method comprising the following steps:

formation of the buried layer in the substrate by ion implantation;
demarcation of an active area of the non-volatile memory cell by the formation of isolation lines extending in a first direction;
formation of the first thin gate isolation layer on the surface of the substrate;
formation of a stacked gate structure on top of the first gate isolation layer, the stacked gate structure comprising the first floating gate, the control gate, and the insulating layer;
formation of the first access transistor comprising the following steps:
  etching of a trench in the substrate substantially from its surface to the buried layer,
  formation of a second thin oxide on the trench walls,
  deposition of doped polysilicon in the trench, said trench being adjacent to the stacked gate structure;
passivation and metallization of the non-volatile memory cell.

Furthermore, programming and reading a 2T non-volatile memory cell as disclosed in the second embodiment requires a detection method to detect which 2T non-volatile memory cell is actually programmed. Therefore, the present invention also relates to a method of reading a bit stored in a non-volatile memory cell matrix according to the second embodiment, the method of reading a bit comprising a step of measuring a source-drain current of the first and the second non-volatile memory cell, characterized in that the step of measuring the source-drain current comprises the application of a first voltage pulse to the first control gate, and application of a second voltage pulse to the second control gate, wherein a change of the source-drain current after the application of the first and second voltage pulses determines whether the first non-volatile memory cell and the second non-volatile memory cell, respectively, are programmed or not.

BRIEF DESCRIPTION OF THE DRAWING

Below, the invention will be explained with reference to some drawings, which are intended for illustration purposes only and do not limit the scope of protection as defined in the accompanying claims.

DETAILED DESCRIPTION OF THE INVENTION

As mentioned above, in comparison with a single transistor non-volatile memory cell, a two-transistor non-volatile memory cell provides a memory cell which is highly insensitive to over-erasing and over-programming. As known to persons skilled in the art, reading of such cells is already feasible at low control gate potentials. However, the areal size of a 2T non-volatile memory cell is much larger than the size of a single transistor non-volatile memory cell.

As described above, FIG. 1 schematically shows a cross-section of a planar 2T non-volatile memory cell known from the prior art.

In a first embodiment of the present invention, a further size reduction for 2T non-volatile memory cells is achieved by replacing the horizontal access gate as shown in FIG. 1 with a vertical access gate.

Figure 2:
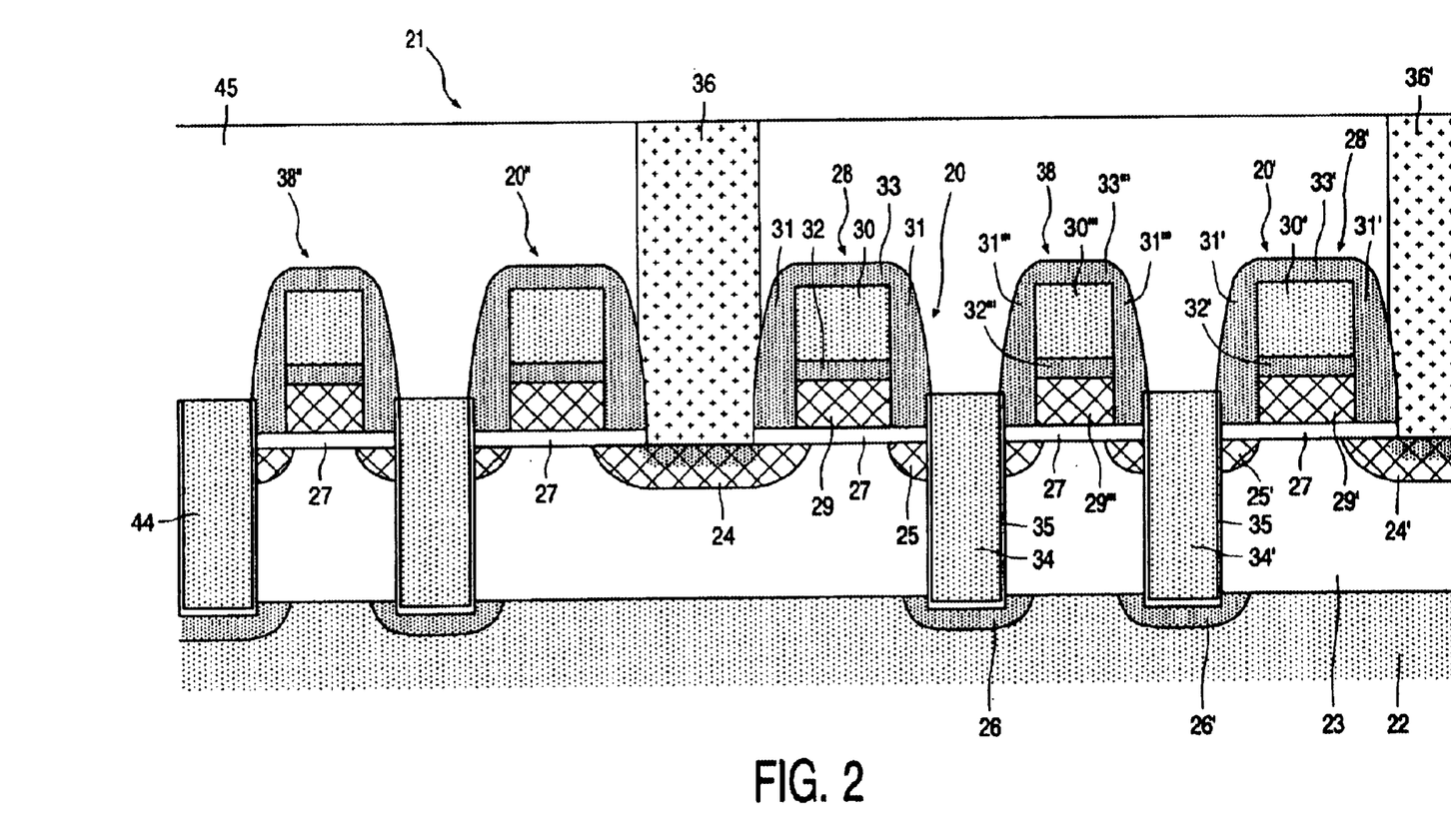
FIG. 2 schematically shows a cross-section of some 2T non-volatile memory cells according to a first embodiment of the present invention.

FIG. 2 schematically shows a cross-section of some 2T non-volatile memory cells 20, 20', 20" according to a first embodiment of the present invention. A substrate 21 comprises a buried n-type doped layer 22, covered by a p-type layer 23. In the p-type layer 23 an n-type drain region 24, 24', and an n-type doped region 25, 25' are present. In the buried n-type doped layer 22, a source region 26, 26' is defined. On the surface of the substrate 21, on top of a thin gate oxide 27, the 2T non-volatile memory cell 20 comprises a stacked structure 28 acting as floating gate transistor, consisting of a floating gate 29, a control gate 30 and side spacers 31. The control gate 30 is separated from the floating gate 29 by an insulating layer 32, preferably an ONO (oxide-nitride-oxide) layer. The top of control gate 30 is covered by an oxide layer 33. Adjacent to the stacked structure 28, there is provided an access transistor 34. The access transistor 34 extends from the substrate surface to the source region 26 in the buried n-type doped layer 22. The access transistor 34 is formed in a trench and delineated by trench walls 35 that also insulate the trench body from the source region 26. The trench walls 35, preferably, consist of a thin oxide film.

On the opposite side of the stacked structure 28, a bit line contact 36 connects with the drain region 24. In the first embodiment, a common source arrangement is used. As a separation between the non-volatile memory cell 20 and an adjacent cell 20', an isolation gate 38 is located between the access transistor 34 and the access transistor 34' of the cell 20'. The isolation gate 38 is identical to the stacked gate 28: a dummy floating gate 29''' covered by an insulating layer 32''' and, on top of the insulating layer 32''', a dummy control gate 30''', with side spacers 31''' covering the side walls of the stack 38. The top of dummy control gate 30''' is covered by an isolation layer 33'''.

The non-volatile memory cell 20' comprises an access transistor 34', a floating gate 29' on thin gate oxide 27, a control gate 30' provided on floating gate 29', a bit line contact 36', and a drain region 24'. Between the control gate 30' and the floating gate 29', an insulating layer 32' is provided. The sidewalls of non-volatile memory cell 20' are covered by side spacers 31. On top of the control gate 30' an oxide layer 33' is present.

Adjacent to the stacked structure 28', there is provided an access transistor 34'. The access transistor 34' extends from the substrate surface to the source region 26' in buried n-type doped layer 22. The access transistor 34' is formed in a trench delineated by trench walls 35 that also insulate the access gate 34' from the source region 26'. The trench walls 35, preferably, consist of a thin oxide film.

A non-volatile memory cell 20" is separated from the cell 20 by the drain region 24 and bit-line contact 36. Again, this cell 20" is separated by an isolation gate 38" from a further non-volatile memory cell of which only an access transistor 44 is shown.

An isolation layer 45 covers the stacked gate structures 28, 28', 38 to electrically insulate the 2T non-volatile memory cells 20, 20', 20".

As shown in FIG. 2, an array of non-volatile memory cells can be formed by alternately linking two cells to an intermediate bit line contact, and separating the access transistors of two cells by an isolation gate.

The electrical circuit comprising two adjacent non-volatile memory cells according to the fist embodiment will be described with reference to FIG. 7.

Figure 3:
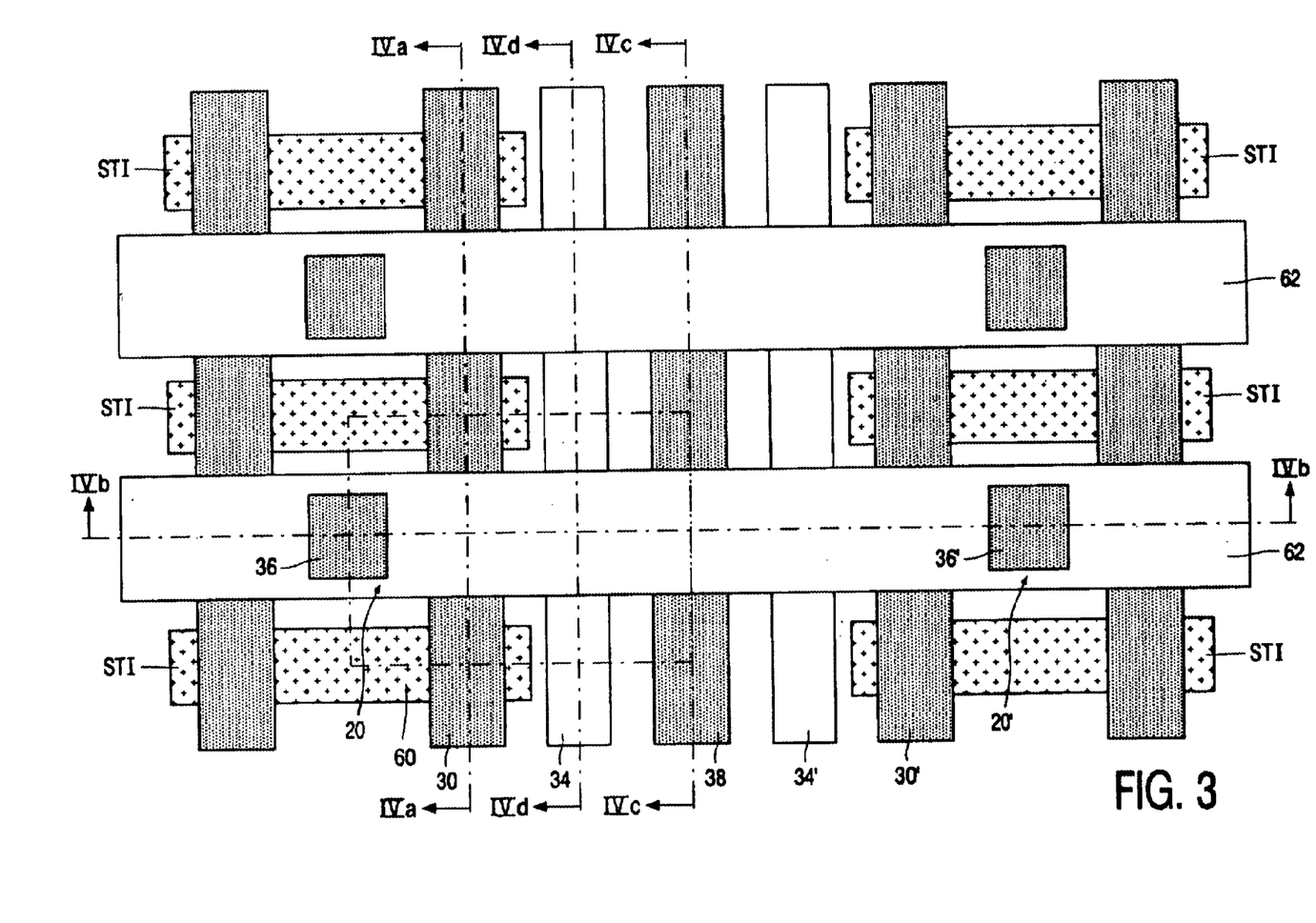
FIG. 3 schematically shows a top view of an array comprising a plurality of 2T non-volatile memory cells according to the first embodiment of the present invention.

FIG. 3 schematically shows a top view of an array comprising a plurality of 2T non-volatile memory cells according to the first embodiment of the present invention. In comparison with FIG. 2, some space is introduced between the displayed elements for reasons of clarity.

In this array, four non-volatile memory cells according to the first embodiment of the present invention are shown. The areal size 60 of one such non-volatile memory cells is marked by dashed lines in FIG. 3.

To obtain a memory array with random access features, in the arrangement according to the first embodiment, bit-lines 62, each connecting a drain region 24 through a bit line contact 36, run in a first direction perpendicular to a second direction wherein the access transistors 34, 34' are extended so as to form access transistor lines 34, 34', respectively. Control gates 30, 30' are extended so as to form control gate lines 30, 30' and run parallel to the access transistor lines 34, 34'. The isolation gates 38, 38" are extended so as to form isolation gate lines running in the same direction as the access transistor lines 34 and the control gate lines 30.

The non-volatile memory cells in the memory array are arranged with a common source in the n-type region 22.

The access transistor lines 34 are arranged as trenched lines, each located in a trench connecting with the common source in the buried n-type doped layer 22.

The control gate lines 30 run parallel to the access transistor lines 34. To define separate cells, a LOCOS isolation or STI is arranged in between the non-volatile memory cells in the p-type layer 23. Moreover, the floating gate 29, 29', consisting of amorphous or polycrystalline Si, is only defined in between two isolation lines STI. Thus, the region for storing a bit in a non-volatile memory cell according to this first embodiment is confined to the region occupied by the floating gate 29, 29'.

Cross-sections IVa along a control gate line 30, IVb along non-volatile memory cells in a nascent state, IVc along an isolation gate line 38, and IVd along an access transistor line 34, according to the arrangement shown in FIG. 3, are shown in FIGS. 4a, 4b, 4c, and 4d, respectively, to illustrate the memory array arrangement in more detail.

Figure 4A:
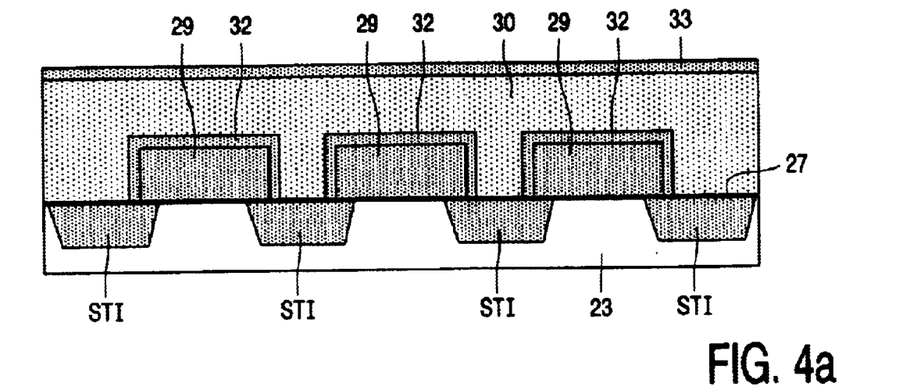
FIG. 4a shows a schematic cross-section along a control gate line according to the first embodiment of the present invention.

FIG. 4a shows a schematic cross-section IVa along a control gate line 30, which clearly shows the separation of non-volatile memory cells by the isolation implantation STI and the separation of the respective floating gates 29 from the control gate (material) 30 by means of the insulating layer 32. The thin gate oxide 27 separates the floating gate 29 from the p-type layer 23 and the isolation lines STI.

Figure 4B:
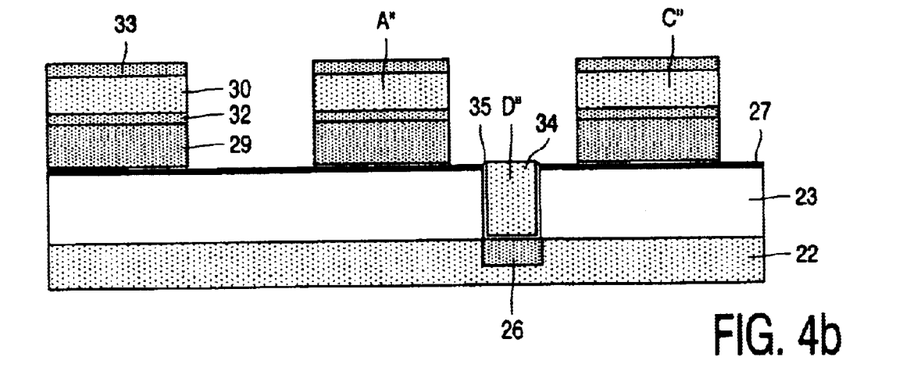
FIG. 4b shows a schematic cross-section of non-volatile memory cells along a line where a bit line is to be formed.

FIG. 4b shows a schematic cross-section IVb of non-volatile memory cells along the line where a bit-line is to be formed. In this cross-section IVb, a number of pillars are shown, each consisting of a floating gate 29 encapsulated by an insulating layer 32 and covered by a control gate 30 and a capping layer 33. The pillar A" is shown in cross-section IVa of FIG. 4a, which is perpendicular to the view in this cross-section. Pillar C" is shown in cross-section IVc of FIG. 4c, which is perpendicular to the view in this cross-section. The access transistor line 34 formed in a trench is denoted by D", which is shown in cross-section IVd of FIG. 4d (also perpendicular to the view in this cross-section). The depicted pillars are separated from the p-type layer 23 by the thin gate oxide 27. The access transistor line 34 is located in a trench in p-type layer 23. The trench walls are covered by thin oxide 35. Below the access transistor line 34, local implantation 26 is located in buried n-type layer 22.

Figure 4C:
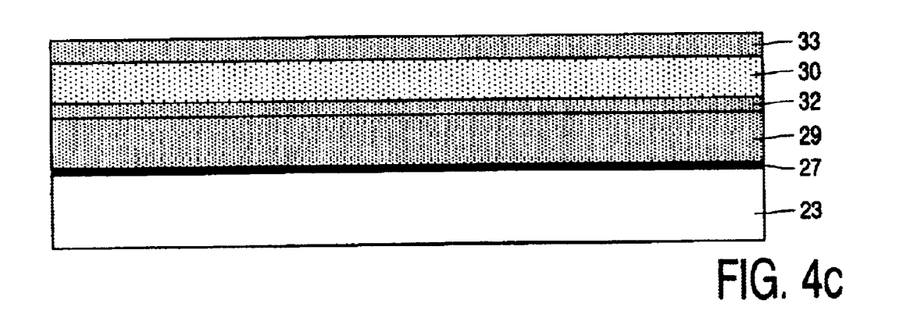
FIG. 4c shows a schematic cross-section along an isolation gate line according to the first embodiment of the present invention.

FIG. 4c shows a schematic cross-section IVc along an isolation gate line 38, cf. FIG. 2. The isolation gate line comprises a stack of layers: On p-type layer 23, the stack consists of thin gate oxide 27, floating gate 29, insulating layer 32, control gate 30 and oxide layer 33.

Figure 4D:
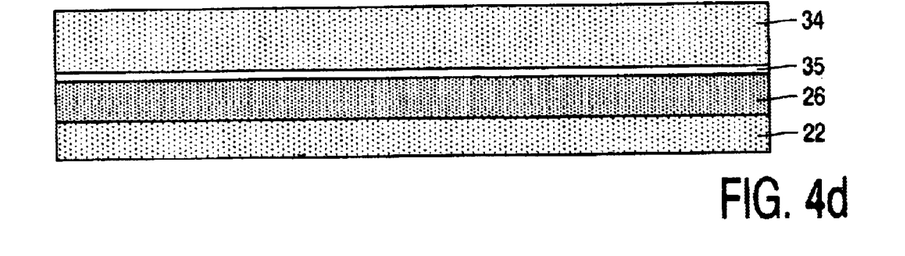
FIG. 4d shows a schematic cross-section along an access gate line according to the first embodiment of the present invention.

Finally, FIG. 4d shows a schematic cross-section IVd along an access transistor line 34 in a trench in p-type-layer 23, which gate line comprises, viewed from bottom to top, buried n-type layer 22, source layer 26, thin oxide 35 and access transistor material, e.g., poly-Si.

It is noted that in FIGS. 4a, 4b 4c, 4d, no local interconnect and no metallization level are shown. In FIG. 3, the bit-line metallization runs parallel to the direction indicated by IVb.

In the following, an exemplary method of manufacturing a Flash cell of the embodiment as shown in FIGS. 2, 3, 4a, 4b, 4c, 4d is described.

The buried n-type doped layer 22 (buried n-well) is formed in the p-type substrate 21 by an ion-implantation process. Subsequently, in the p-type layer 23 the necessary dopant profiles are applied to define the properties of both the horizontal and vertical parts of the 2T non-volatile memory cell to be formed. The active areas of adjacent non-volatile memory cells are separated in a first direction by oxidic (SiO$_2$) isolation lines (not shown in FIG. 2) formed by LOCOS or by STI technology.

On the thin gate oxide 27 a stacked gate structure is being formed, which confines each non-volatile memory cell in a second direction perpendicular to the first direction. The thickness of the thin gate oxide 27 is typically 5–10 nm. A first layer of poly-Si is deposited in a thickness of 10–200 nm. The layer is doped in-situ or by a later ion implantation step. In this first poly-Si layer, trenches are etched to form floating gates. The trenches are each parallel to the oxidic isolation lines STI. Each trench is located on top of one of the oxidic isolation lines STI. Next, an insulating layer 32 e.g., an ONO (oxide-nitride-oxide) layer, is deposited in a thickness of typically 15 nm.

Then, a second poly-Si layer is deposited in a thickness of 100–300 nm to form control gates. The layer is doped in-situ or by a later ion-implantation step. Finally, an oxide or nitride capping layer 33 is deposited.

In the next step, the stacked layers are etched to define a plurality of lines, which are directed perpendicularly to the oxide isolation lines STI. These lines will later be the control gate lines 30. In this manner, stacked gate Flash cells are formed, as is known to persons skilled in the art. Simultaneously, the isolation gate lines 38 are manufactured in the same processing steps.

Subsequently, an oxidation step and/or annealing step is carried out, followed by the formation of dopant profiles of source 26 and drain 24. The dopant profile of source 26 is optional in this embodiment. A second oxidation step and/or annealing step may be done.

In the next step, the side spacers 31 are formed. In an alternative embodiment, the formation of the side spacers 31 is omitted.

In the following step, trenches are etched in the source regions. The trenches extend as far as (or into) the buried n-well layer 22. The walls of the trenches are covered by an oxide layer 35. Successively, poly-Si is deposited in each trench and, preferably, doped in-situ to form the access transistor 34, 34', 34". The excess poly-Si outside the trenches is removed.

Finally, an isolation layer 45 is deposited to cover the stacked gate structures 28, 28', 28". Subsequently, the drains 24, 24', the buried n-well layer 22 and the access transistors 34, 34', 34" are provided with contacts, followed by metallization steps to obtain connections between the FLASH cells and other structures.

Figure 5:
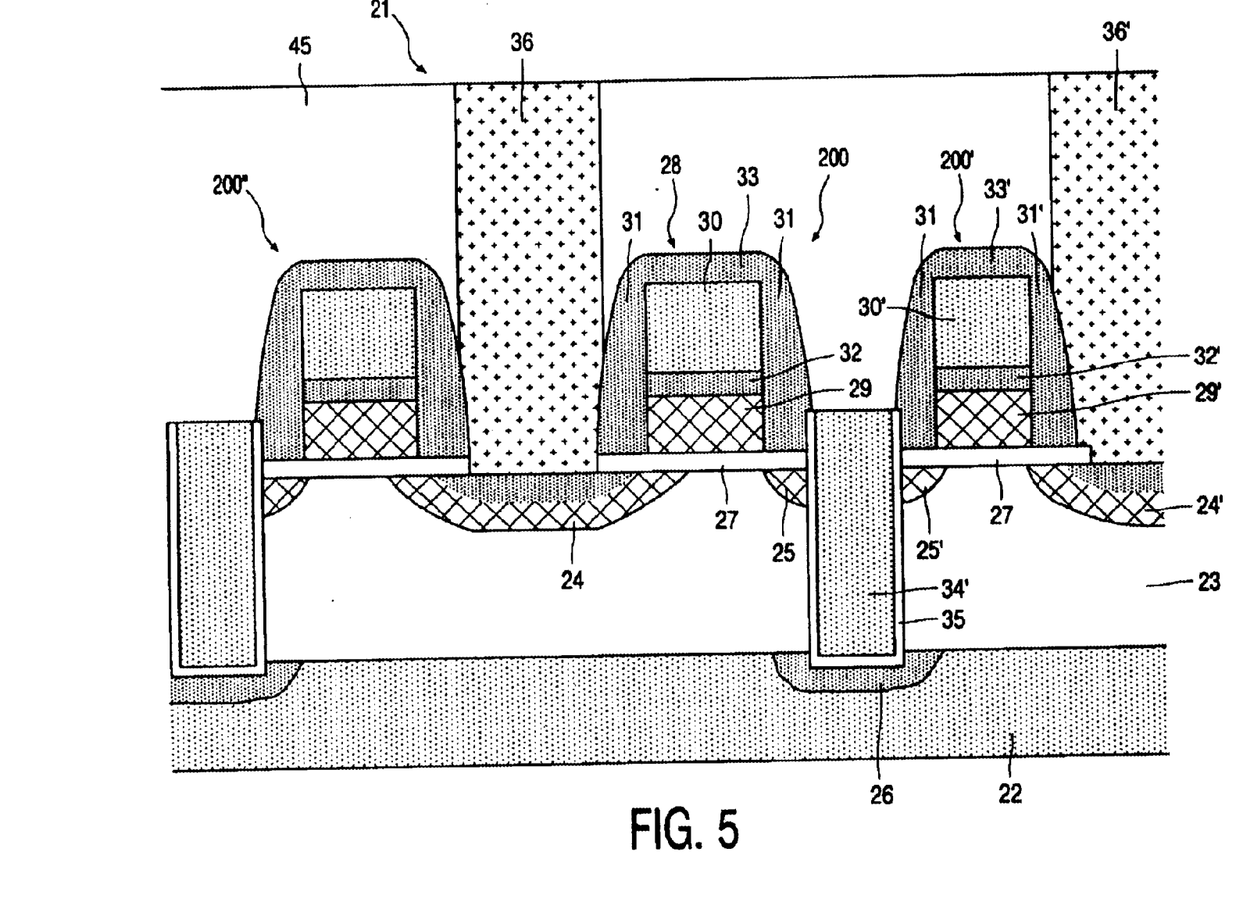
FIG. 5 schematically shows a cross-section of some 2T non-volatile memory cells according to a second embodiment of the present invention.

FIG. 5 schematically shows a cross-section of a 2T non-volatile memory cell 200 according to a second embodiment of the present invention.

In FIG. 5, entities with the same reference numbers as in FIG. 2, refer to the same entities as in FIG. 2.

Adjacent to the stacked gate structure 28, an access transistor 34' is provided, which extends from the substrate surface to the source region 26 in buried n-type doped layer 22.

Also in this second embodiment, a common source arrangement is used. Between the 2T non-volatile memory cell 200 and an adjacent similar 2T non-volatile memory cell 200', no isolation is provided.

Also, the cells 200 and 200' share the same bit line (not shown) located above the bit line contacts 36 and 36'. To control the read-out of each of the cells 200, 200', a reading procedure is performed which will be explained in more detail with reference to FIG. 8.

A further adjacent non-volatile memory cell 200" is separated from the cell 200 by the drain region 24.

Figure 6:
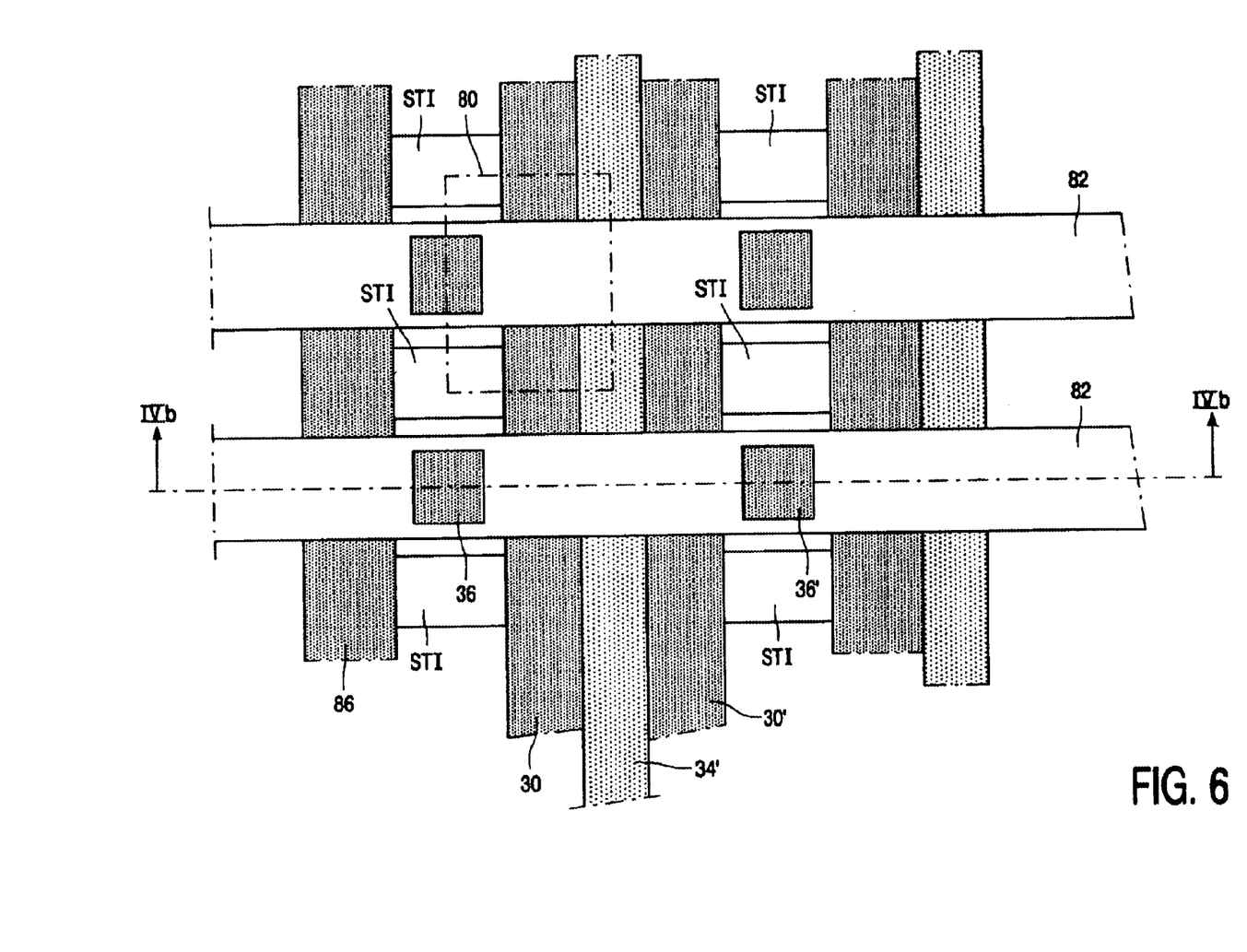
FIG. 6 schematically shows a top view of an array comprising a plurality of 2T non-volatile memory cells according to the second embodiment of the present invention.

FIG. 6 schematically shows a top view of an array comprising a plurality of 2T non-volatile memory cells according to the second embodiment of the present invention. In comparison with FIG. 5, some space is introduced between the displayed elements for reasons of clarity.

In this memory array, four non-volatile memory cells according to the second embodiment of the present invention are shown. The areal size 80 of one such non-volatile memory cell is marked in FIG. 6 by dashed lines.

To obtain a memory array with random access features, in the arrangement according to the second embodiment, the bit lines 82 for connecting the drain regions 24 through bit line contact 36, run in a first direction perpendicular to a second direction for the access transistor lines 34'. The control gate lines 30 for connecting the control gates 30 run parallel to the access transistor line 34'.

The non-volatile memory cells in the memory array are arranged with a common source in the n-type region 22.

The access transistor line 34' is arranged as a trenched line, located in a trench on top of the common source in the buried n-type doped layer 22.

The control gate lines 30 run parallel to the access transistor line 34'. To define separate cells, a LOCOS isolation or an STI isolation line STI is arranged in between the non-volatile memory cells in the p-type layer 23. Moreover, the floating gate 29, consisting of amorphous or poly crystalline Si, is only defined in between two isolation lines STI. Thus, the region for storing a bit in a non-volatile memory cell according to this second embodiment is confined to the region occupied by the floating gate 29.

Figure 7:
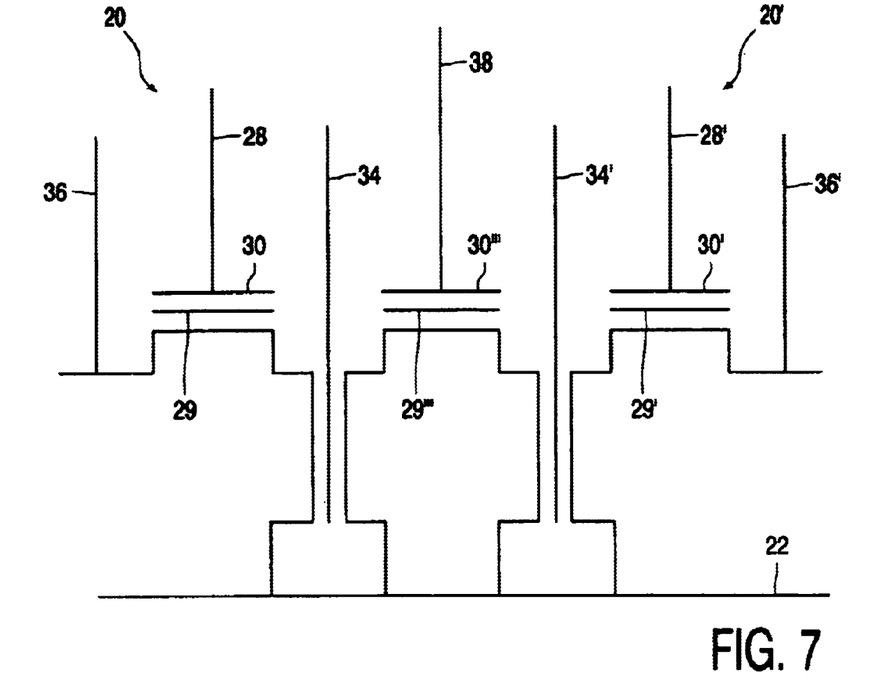
FIG. 7 shows an electrical circuit diagram of the arrangement of 2T non-volatile memory cells according to the first embodiment.

FIG. 7 shows an electrical circuit diagram of two 2T non-volatile memory cells according to the first embodiment, in which the two 2T non-volatile memory cells 20, 20' are separated by an isolation gate 38. In FIG. 7, entities with the same reference numbers as used in FIG. 2 refer to the same entities as shown in FIG. 2.

In the circuit of 2T non-volatile memory cell 20, an electrical potential on the control gate 30 can be controlled independently of an electrical potential on the access transistor 34. Similarly, in 2T non-volatile memory cell 20', a potential on the control gate 48 can be controlled independently of a potential on the access transistor 34'.

Programming of each 2T non-volatile memory cell 20, 20' can be done by Fowler-Nordheim tunnelling (FN) or Source Side Injection (SSI) in ways known in the art. Reading and erasure of each cell 20, 20' can also be done by mechanisms known in the art.

Figure 8:
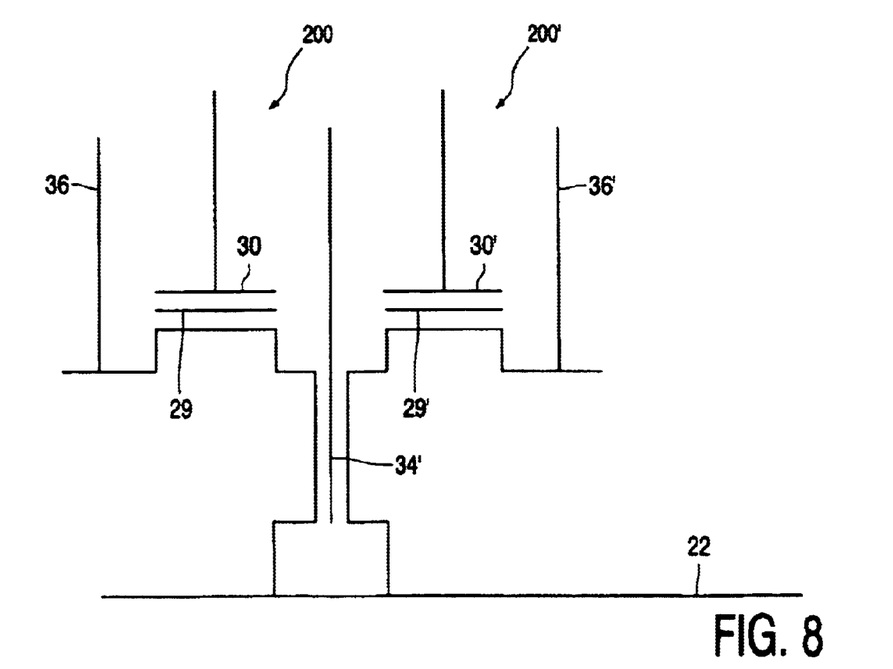
FIG. 8 shows an electrical circuit diagram of the arrangement of 2T non-volatile memory cells according to the second embodiment.

FIG. 8 shows an electrical circuit diagram of the 2T non-volatile memory cells 200, 200' according to the second embodiment of the present invention.

In this second embodiment, the two 2T non-volatile memory cells 200, 200' are not separated by an isolation. In FIG. 8, entities with the same reference numbers as used in FIG. 5 refer to the same entities as shown in FIG. 5.

In the circuit of 2T non-volatile memory cell 200, an electrical potential on the control gate 30 can be controlled independently of an electrical potential on the access transistor 34'. Similarly, in the 2T non-volatile memory cell 200', a potential on the control gate can be controlled independently of a potential on the access transistor 34'.

Programming of each 2T non-volatile memory cell 200, 200' can then be done by Fowler-Nordheim tunnelling (FN) or Source Side Injection (SSI) in ways known in the art.

Selective read-out of one of the two 2T non-volatile memory cells 200, 200' may not be directly obvious. By setting a potential of 1.2 V on the access transistor 34' and a potential of 0.5 V on the bit line contacts 36 and 36', the cells 200, 200' can be read. If none of the cells 200, 200' are programmed (i.e. containing a charge), no current will be present. If, however, one or two cells are programmed, a current will flow in the circuit. By substantially measuring the read-out current in response to sequentially applying a pulse (1.2 V) to the control gate of each cell, the modulation of the read-out current reveals which of the cells is in the programmed state. If a positive pulse on the control gate of a cell affects the measured read-out current, the respective cell is in the non-programmed (erased) state. If, for example, a pulse on a first cell 200 affects the read-out current, a modulation will be found, which indicates that the first cell 200 is in a non-programmed state. If not, both the first cell 200 and the second cell 200' may be programmed. A second pulse on the second cell 200' may affect the read-out current, which indicates the state of the second cell 200'. Comparing the results for the two pulses indicates which of the cells 200 and 200' is actually in the programmed state.

It is noted that in a programmed cell, a pulse on the control gate does not substantially affect the programmed cell when the pulse comprises a relatively low potential in comparison with the programming and/or erasure voltages.

In comparison with a flash cell of the prior art as shown in FIG. 1, the areal size of a 2T non-volatile memory cell can be reduced significantly. Using 0.18 μm design rules, in a prior art 2T non-volatile memory cell as shown in FIG. 1, source and drain contacts typically are 0.24 μm wide. The stacked gate 6, 7, 8, 9, 14 and the access transistor 10, each isolated by side spacers 9 and 11, respectively, occupy a width of 0.48 μm (gate: 0.24 μm, spacer: 0.06 μm). Taking into account an interstitial space of 0.14 μm between the gate spacers of the control/floating gate and the access transistor, the total width of a cell is 1.1 μm (taking the half width of source and drain). Using a length of each cell of 0.56 μm, the areal size of a cell is 0.62 μm².

In the first embodiment of the present invention, as shown in FIG. 2, the width of a cell is only 0.78 μm (using drain contact width: 0.24 μm, spacer: 0.06 μm, access transistor: 0.14 μm, and isolation gate: 0.24 μm, and taking the half width of the drain and isolation gate). An access transistor trench width of 0.14 μm can be obtained using the appropriate processing technology, as known in the art. At an equal cell length of 0.56 μm, the areal size 60 of a non-volatile memory cell of the first embodiment of the present invention is 0.44 μm².

The cell width of a flash cell in the second embodiment is only 0.55 μm using the same size of the control gate/floating gate stack as in the first embodiment (and the half width of the drain, the half width of the access transistor). The areal size of this non-volatile memory cell is 0.31 μm².

In comparison with the 2T non-volatile memory cell of the prior art as shown in FIG. 1, a size reduction of approximately 30% and 50% can be obtained by using the layout of a 2T non-volatile memory cell according to the first and second embodiment, respectively.

It should be understood that the sizes mentioned above are only used to illustrate the size reduction which can be obtained using the non-volatile memory cell according to the present invention.

What is claimed is:

1. A semiconductor device comprising in a semiconductor substrate containing a first dopant type, a first non-volatile memory cell for storing a bit, comprising a first drain region in said substrate, a first floating gate, a first control gate, a first thin gate isolation layer, and an insulating layer, said insulating layer being positioned on top of said first floating gate, said first control gate being positioned on top of said insulating layer, said first floating gate being positioned on top of said first thin gate isolation layer, and further comprising a first access transistor for controlling access to said first non-volatile memory cell, wherein said semiconductor device comprises a buried layer in said substrate which contains both a second dopant type and a first source region, said first access transistor is formed in a first trench on said substrate, said first trench extending substantially from said first source region to said surface of said substrate, said first trench being adjacent to said first floating gate and directed in a first direction parallel to said surface of said substrate.

2. A semiconductor device according to claim 1, comprising in said semiconductor substrate, a second non-volatile memory cell for storing a bit, comprising a second drain region in said substrate, a second floating gate, a second control gate, a second thin gate isolation layer, and a second insulating layer, said second insulating layer being positioned on top of said second floating gate, said second control gate being positioned on top of said second insulating layer, said second floating gate being positioned on top of said second thin gate isolation layer, said buried layer containing a second source region, said device further comprising a second access transistor for controlling access to said second non-volatile memory cell, said second non-volatile memory cell being adjacent to said first non-volatile memory cell in a second direction, said second direction being parallel to said surface of said substrate and perpendicular to said first direction, wherein said second access transistor is formed in a second trench on said substrate, said second trench extending substantially from said second source region to the surface of said substrate, said second trench being adjacent to said second floating gate and directed in said second direction, and said first access transistor of said first non-volatile memory cell being separated from said second access transistor of said second non-volatile memory cell by an isolation gate, comprising a dummy floating gate, a dummy insulating layer and a dummy control gate, said dummy insulating layer being positioned on top of said dummy floating gate, said dummy control gate being positioned on top of said dummy insulating layer.

3. A semiconductor device according to claim 1, comprising in said semiconductor substrate, a second non-volatile memory cell for storing a bit, comprising a second drain region in said substrate, a second floating gate, a second control gate, said second thin gate isolation layer, and a second insulating layer, said second insulating layer being positioned on top of said second floating gate, said second control gate being positioned on top of said second insulating layer, said second floating gate being positioned on top of said second thin gate isolation layer, said buried layer containing a second source region, said device further comprising a second access transistor for controlling access to said second non-volatile memory cell, said second non-volatile memory cell being adjacent to said first non-volatile memory cell in a second direction, said second direction being parallel to said surface of said substrate and perpendicular to said first direction, wherein said second access transistor is formed in a second trench on said substrate, said second trench extending substantially from said second source region to said surface of said substrate, said second trench being adjacent to said second floating gate and directed in said second direction, and said first access transistor of said first non-volatile memory cell coinciding with said second access transistor of said second non-volatile memory cell.

4. A non-volatile memory cell matrix comprising a plurality of non-volatile memory cells according to claim 2, wherein said plurality of non-volatile memory cells is arranged in said first direction and said second direction.

5. A non-volatile memory cell matrix according to claim 2, wherein said plurality of non-volatile memory cells are arranged in a common source arrangement.

6. A non-volatile memory cell matrix according to claim 4, wherein a first row of non-volatile memory cells is separated from a second row of non-volatile memory cells by an isolation line (STI) extending in said first direction.

7. A semiconductor device comprising a non-volatile memory cell matrix according to claim 1.

8. A semiconductor device comprising in a semiconductor substrate containing a first dopant type, a first non-volatile memory cell for storing a bit, comprising a first drain region in said substrate, a first floating gate, a first control gate, a first thin gate isolation layer, and an insulating layer, said insulating layer being positioned on top of said first floating gate, said first control gate being positioned on top of said insulating layer, said first floating gate being positioned on top of said first thin gate isolation layer, and further comprising a first access transistor for controlling access to said first non-volatile memory cell;

wherein said semiconductor device comprises a buried layer in said substrate which contains both a second dopant type and a first source region, said first access transistor is formed in a first trench on said substrate, said first trench extending substantially from said first source region to said surface of said substrate, said first trench being adjacent to said first floating gate and directed in a first direction parallel to said surface of said substrate;

a second non-volatile memory cell having a second access transistor; and an isolation gate for separating the first access transistor from the second access transistor.

* * * * *